(12) United States Patent  
Kishimoto

(10) Patent No.: US 10,644,256 B2  
(45) Date of Patent: May 5, 2020

(54) ORGANIC ELECTROLUMINESCENT DISPLAY DEVICE AND METHOD FOR PRODUCING SAME

(71) Applicant: Sakai Display Products Corporation, Sakai-shi, Osaka (JP)

(72) Inventor: Katsuhiko Kishimoto, Sakai (JP)

(73) Assignee: Sakai Display Products Corporation, Osaka (JP)

(*) Notice: Subject to any disclaimer, the term of this patent is extended or adjusted under 35 U.S.C. 154(b) by 90 days.

(21) Appl. No.: 16/079,444

(22) PCT Filed: Dec. 25, 2017

(86) PCT No.: PCT/JP2017/046472  
§ 371 (c)(1),  
(2) Date: Aug. 23, 2018

(87) PCT Pub. No.: WO2019/130401  
PCT Pub. Date: Jul. 4, 2019

(65) Prior Publication Data  
US 2019/0363281 A1 Nov. 28, 2019

(51) Int. Cl.  
*H01L 27/32* (2006.01)  
*H01L 51/52* (2006.01)  
*H01L 51/56* (2006.01)

(52) U.S. Cl.  
CPC ........ *H01L 51/5237* (2013.01); *H01L 27/326* (2013.01); *H01L 27/3246* (2013.01);  
(Continued)

(58) Field of Classification Search  
None  
See application file for complete search history.

(56) References Cited

U.S. PATENT DOCUMENTS

2007/0132381 A1 6/2007 Hayashi et al.  
2008/0129194 A1 6/2008 Abe et al.  
(Continued)

FOREIGN PATENT DOCUMENTS

JP 2007-157606 A 6/2007  
JP 2007-250370 A 9/2007  
(Continued)

OTHER PUBLICATIONS

Decision to Grant for related Japanese Application No. 2018-527257 dated Jul. 10, 2018.  
(Continued)

*Primary Examiner* — Grant S Withers  
(74) *Attorney, Agent, or Firm* — Renner, Otto, Boisselle & Sklar, LLP

(57) ABSTRACT

An organic EL display device (100) includes an element substrate including a substrate, a plurality of organic EL elements supported by the substrate and respectively located in the plurality of pixels, and a bank layer (48) defining each of the plurality of pixels; and a thin film encapsulation structure (10) covering the plurality of pixels. The bank layer has an inclining surface enclosing each of the plurality of pixels. The thin film encapsulation structure includes a first inorganic barrier layer (12), an organic barrier layer (14) including a plurality of solid portions in contact with a top surface of the first inorganic barrier layer and distributed discretely, and a second inorganic barrier layer (16) in contact with the top surface of the first inorganic barrier layer and top surfaces of the plurality of solid portions of the organic barrier layer. The plurality of solid portions include pixel periphery solid portions (14a) each extending, on the first inorganic barrier layer, from a portion on the inclining surface to a peripheral area in the corresponding pixel of the plurality of pixels, the pixel periphery solid portions each  
(Continued)

extending along the entirety of a circumference of the pixel. A refractive index n0 of the organic barrier layer is smaller than a refractive index n1 of the second inorganic barrier layer, and the top surfaces of the pixel periphery solid portions each have an inclination angle θa larger than, or equal to, 20 degrees.

13 Claims, 7 Drawing Sheets

(52) U.S. Cl.
CPC ...... *H01L 51/5262* (2013.01); *H01L 51/5275* (2013.01); *H01L 51/56* (2013.01)

(56) References Cited

U.S. PATENT DOCUMENTS

| | | |
|---|---|---|
| 2015/0060822 A1 | 3/2015 | Kamiya et al. |
| 2016/0043346 A1 | 2/2016 | Kamiya et al. |
| 2016/0126495 A1 | 5/2016 | Oka et al. |
| 2017/0250380 A1 | 8/2017 | Kato |
| 2017/0357125 A1 | 12/2017 | Tojo |
| 2018/0159085 A1 | 6/2018 | Yoshida |

FOREIGN PATENT DOCUMENTS

| | | |
|---|---|---|
| JP | 2008-108628 A | 5/2008 |
| JP | 2015-050022 A | 3/2015 |
| JP | 2016-039120 A | 3/2016 |
| JP | 2017-151313 A | 8/2017 |
| JP | 2017-157568 A | 9/2017 |
| JP | 2017-224416 A | 12/2017 |
| WO | WO 2014/196137 A1 | 12/2014 |
| WO | WO 2016/194801 A1 | 12/2016 |

OTHER PUBLICATIONS

PCT International Search Report for related International Application No. PCT/JP2017/046472 dated Mar. 20, 2018.

(a)

(b)

(a)

(b)

(c)

ORGANIC ELECTROLUMINESCENT DISPLAY DEVICE AND METHOD FOR PRODUCING SAME

TECHNICAL FIELD

The present invention relates to an organic EL display device and a method for producing the same.

BACKGROUND ART

Organic EL (Electro-Luminescence) display devices start being put into practical use. One feature of an organic EL display device is being flexible. An organic EL display device includes, in each of pixels, at least one organic EL element (Organic Light Emitting Diode: OLED) and at least one TFT (Thin Film Transistor) controlling an electric current to be supplied to each of the at least one OLED. Hereinafter, an organic EL display device will be referred to as an "OLED display device". Such an OLED display device including a switching element such as a TFT or the like for each of OLEDs is called an "active matrix OLED display device". A substrate including the TFTs and the OLEDs will be referred to as an "element substrate".

An OLED (especially, an organic light emitting layer and a cathode electrode material) is easily influenced by moisture to be deteriorated and to cause display unevenness. One technology developed in order to provide an encapsulation structure that protects the OLED against moisture while not spoiling the flexibility of the OLED display device is a thin film encapsulation (TFE) technology. According to the thin film encapsulation technology, an inorganic barrier layer and an organic barrier layer are stacked alternately to provide a sufficient level of barrier property against water vapor with these thin films. From the point of view of the moisture-resistance reliability of the OLED display device, such a thin film encapsulation structure is typically required to have a WVTR (Water Vapor Transmission Rate) lower than, or equal to, $1 \times 10^{-4}$ g/m$^2$/day.

A thin film encapsulation structure used in OLED display devices commercially available currently includes an organic barrier layer (polymer barrier layer) having a thickness of about 5 μm to about 20 μm. Such a relatively thick organic barrier layer also has a role of flattening a surface of the element substrate. However, such a thick organic barrier layer involves a problem that the bendability of the OLED display device is limited.

Patent Document No. 1 discloses a thin film encapsulation structure including a first inorganic material layer, a first resin member and a second inorganic material layer provided on the element substrate in this order, with the first inorganic material layer being closest to the element substrate. In this thin film encapsulation structure, the first resin member is present locally, more specifically, around a protruding portion of the first inorganic material layer (first inorganic material layer covering a protruding portion). According to Patent Document No. 2, the first resin member is present locally, more specifically, around the protruding portion, which may not be sufficiently covered with the first inorganic material layer. With such a structure, entrance of moisture or oxygen via the non-covered portion is suppressed. In addition, the first resin member acts as an underlying layer for the second inorganic material layer. Therefore, the second inorganic material layer is properly formed and properly covers a side surface of the first inorganic material layer with an expected thickness. The first resin member is formed as follows. An organic material heated and vaporized to be mist-like is supplied onto an element substrate maintained at a temperature lower than, or equal to, room temperature. The organic material is condensed and put into liquid drops on the substrate. The organic material in liquid drops moves on the substrate by a capillary action or a surface tension to be present locally, more specifically, at a border between a side surface of the protruding portion of the first inorganic material layer and a surface of the substrate. Then, the organic material is cured to form the first resin member at the border. Patent Document No. 2 also discloses an OLED display device including a similar thin film encapsulation structure.

The thin film encapsulation structure, described in each of Patent Documents Nos. 1 and 2, including an organic barrier layer formed of a resin member that is present locally does not include a thick organic barrier layer, and therefore, is considered to improve the bendability of the OLED display device.

Patent Document No. 3 discloses an OLED display device as described below. A bank layer is formed at the border between pixels. A side surface of the bank layer includes a steeply inclining cliff portion, having an inclination angle larger than, or equal to, 90 degrees, along most of a circumference of each of the pixels, and also includes a slowly inclining portion, having an inclination angle smaller than 90 degrees, along a part of the circumference of each of the pixels. With such a structure, a flattening layer (corresponding to an organic barrier layer in this specification) included in a thin film encapsulation structure formed on the bank layer is suppressed from being delaminated. On the slowly inclining portion shown in FIG. 5 of Patent Document No. 3, the flattening layer has an inclination angle of about 12 degrees. In a conventional thin film encapsulation structure shown in FIG. 12 of Patent Document No. 3, a flattening layer has an inclination angle of about 10 degrees.

CITATION LIST

Patent Literature

Patent Document No. 1: WO2014/196137
Patent Document No. 2: Japanese Laid-open Patent Publication No. 2016-39120
Patent Document No. 3: Japanese Laid-Open Patent Publication No. 2015-50022

SUMMARY OF INVENTION

Technical Problem

The studies made by the present inventor have found that the front luminance and the directivity of an organic EL display device are influenced by the presence of an organic barrier layer (flattening layer in Patent Document No. 3).

The present invention has an object of providing an organic EL display device having an improved front luminance and an improved directivity, and a method for producing the same.

Solution to Problem

An organic EL display device according to an embodiment of the present invention is an organic EL display device including a plurality of pixels. The organic EL display device comprises an element substrate including a substrate, a plurality of organic EL elements supported by the substrate and respectively located in the plurality of pixels, and a bank layer defining each of the plurality of pixels; and a thin film encapsulation structure covering the plurality of pixels. The bank layer has an inclining surface enclosing each of the plurality of pixels. The thin film encapsulation structure includes a first inorganic barrier layer, an organic barrier layer including a plurality of solid portions in contact with a top surface of the first inorganic barrier layer and distributed discretely, and a second inorganic barrier layer in contact with the top surface of the first inorganic barrier layer and top surfaces of the plurality of solid portions of the organic barrier layer. The plurality of solid portions include pixel periphery solid portions each extending, on the first inorganic barrier layer, from a portion on the inclining surface to a peripheral area in a corresponding pixel of the plurality of pixels, the pixel periphery solid portions each extending along the entirety of a circumference of the pixel. A refractive index n0 of the organic barrier layer is smaller than a refractive index n1 of the second inorganic barrier layer, and the top surfaces of the pixel periphery solid portions each have an inclination angle θa larger than, or equal to, 20 degrees. It is preferred that the inclination angle θa of each of the top surfaces of the pixel periphery solid portions is larger than, or equal to, 30 degrees. The inclination angle θa is substantially the same along the entirety of the circumference of the pixel.

In an embodiment, the inclination angle θa of each of the top surfaces of the pixel periphery solid portions is smaller than, or equal to, 40 degrees.

In an embodiment, the inclining surface of the bank layer has an inclination angle θb of 20 degrees or larger and 60 degrees or smaller.

In an embodiment, the refractive index n1 of the second inorganic barrier layer and the refractive index n0 of the organic barrier layer have a difference ($\Delta n1 = n1 - n0$) that is larger than, or equal to, 0.25.

In an embodiment, the refractive index n1 of the second inorganic barrier layer is 1.75 or larger and 1.90 or smaller. It is preferred that the refractive index n1 of the second inorganic barrier layer is 1-80 or larger.

In an embodiment, a refractive index of the first inorganic barrier layer is equal to the refractive index n1 of the second inorganic barrier layer. It is preferred that the first inorganic barrier layer and the second inorganic barrier layer are each a silicon nitride film (SiN film).

In an embodiment, the pixel periphery solid portions each have a recessed surface. The pixel periphery solid portions having such a structure are formed by use of a resin having a high adhesiveness (wettability) to the bank layer.

It is preferred that the organic barrier layer is formed of a colorless and transparent photocurable resin (e.g., acrylic resin).

A method for producing an organic EL display device according to an embodiment of the present invention is a method for producing the organic EL display device of any of the above. The step of forming the thin film encapsulation structure includes the steps of preparing the element substrate having the first inorganic barrier layer formed thereon in a chamber; supplying a vapor-like or mist-like photocurable resin into the chamber; condensing the photocurable resin on the first inorganic barrier layer to form a liquid film; irradiating the liquid film of the photocurable resin with light to form a photocurable resin layer; and partially ashing the photocurable resin layer to form the organic barrier layer. The viscosity and/or the wettability to the inclining surface, for example, of the photocurable resin are controlled such that a liquid film is formed on the inclining surface of the bank layer. The surface of the inclining surface may be modified in order to adjust the wettability or the like of the photocurable resin.

A method for producing an organic EL display device according to an embodiment of the present invention is a method for producing the organic EL display device of any of the above. The step of forming the organic barrier layer is performed by spraying, spin-coating, slit-coating, screen printing or inkjet printing. The method may further include the step of ashing. The organic barrier layer may be formed of a photosensitive resin, and mask exposure may be performed. The pixel periphery solid portions may be formed, and also an inorganic barrier layer joint portion, where the first inorganic barrier layer and the second inorganic barrier layer are in direct contact with each other, may also be formed, by the mask exposure.

Advantageous Effects of Invention

An embodiment of the present invention provides an organic EL display device having an improved front luminance and an improved directivity, and a method for producing the same.

BRIEF DESCRIPTION OF DRAWINGS

FIG. 3(a) is a cross-sectional view taken along line 3A-3A' in FIG. 2, FIG. 3(b) is a cross-sectional view taken along line 3B-3B' in FIG. 2, and FIG. 3(c) is a cross-sectional view taken along line 3C-3C in FIG. 2.

FIG. 6(a) is a cross-sectional view taken along line 6A-6A' in FIG. 5, and FIG. 6(b) is a cross-sectional view taken along line 6B-6B' in FIG. 5.

DESCRIPTION OF EMBODIMENTS

Hereinafter, an OLED display device and a method for producing the same according to an embodiment of the present invention will be described with reference to the drawings. The embodiments of the present invention are not limited to the embodiments described below as an example. For example, an organic EL display device according to an embodiment of the present invention nay include, for example, a glass substrate instead of a flexible substrate.

Figure 1:
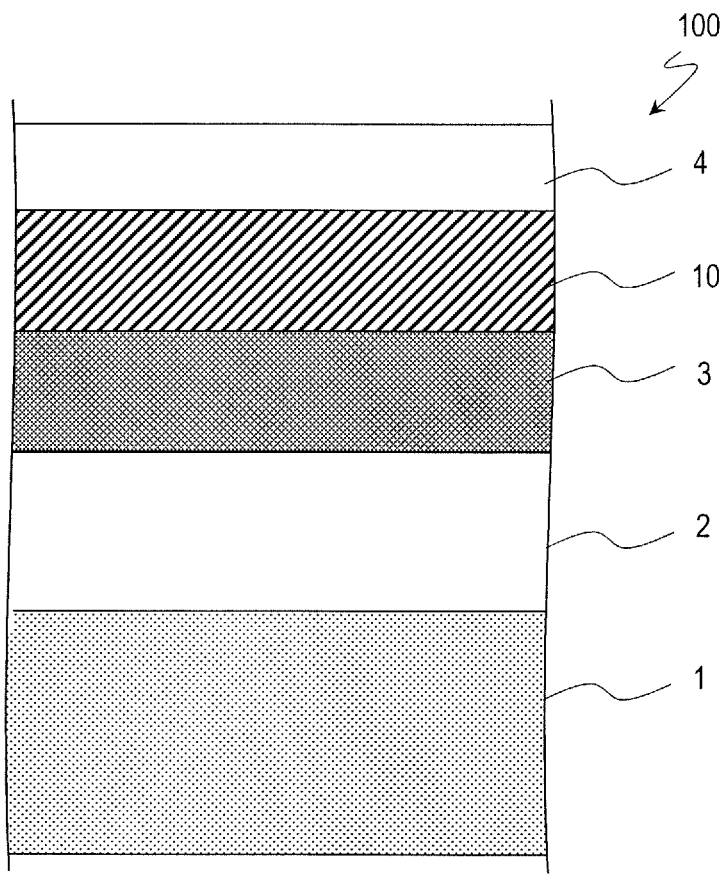
FIG. 1(a) is a schematic partial cross-sectional view of an active region of an OLED display device 100 according to an embodiment of the present invention.
FIG. 1(b) is a partial cross-sectional view of a TFE structure 10 formed on an OLED 3.
Figure 1:
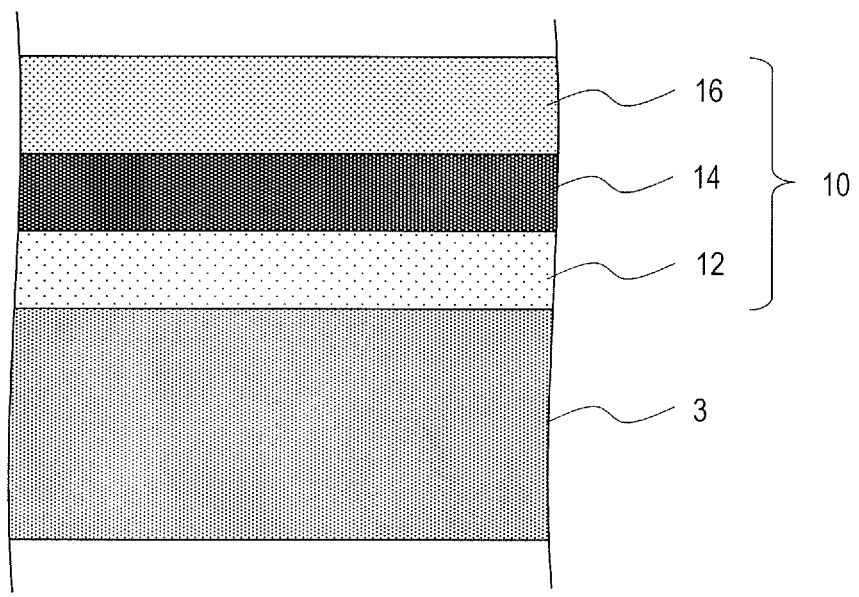

First, with reference to FIG. 1(a) and FIG. 1(b), a basic structure of an OLED display device 100 according to an embodiment of the present invention will be described. FIG. 1 (a) is a schematic partial cross-sectional view of an active region of the OLED display device 100 according to an embodiment of the present invention. FIG. 1(b) is a partial cross-sectional view of a TFE structure 10 formed on an OLED 3.

The OLED display device 100 includes a plurality of pixels, and each of the pixels includes at least one organic EL element (OLED). Herein, a structure corresponding to one OLED will be described for the sake of simplicity.

As shown in FIG. 1(a), the OLED display device 100 includes a flexible substrate (hereinafter, may be referred to simply as a "substrate") 1, a circuit (back plane) 2 formed on the substrate 1 and including a TFT, the OLED 3 formed on the circuit 2, and the TFE structure 10 formed on the OLED 3. The OLED 3 is, for example, of a top emission type. An uppermost portion of the OLED 3 is, for example, an upper electrode or a cap layer (refractive index adjusting layer). An optional polarizing plate 4 is located on the TFE structure 10.

The substrate 1 is, for example, a polyimide film having a thickness of 15 μm. The circuit 2 including the TFE has a thickness of, for example, 4 μm. The OLED 3 has a thickness of, for example, 1 μm. The TFE structure 10 has a thickness that is, for example, less than, or equal to, 1.5 μm.

FIG. 1(b) is a partial cross-sectional view of the TFE structure 10 formed on the OLED 3. The TFE structure 10 includes a first inorganic barrier layer (e.g., SiN layer; 12, an organic barrier layer (e.g., acrylic resin layer) 14, and a second inorganic barrier layer (e.g., SiN layer) 16. The first inorganic barrier layer 12 is formed immediately on the OLED 3. The organic barrier layer 14 includes a plurality of solid portions that are in contact with a top surface of the first inorganic barrier layer 12 and are distributed discretely. The second inorganic barrier layer 16 is in contact with the top surface of the first inorganic barrier layer 12 and top surfaces of the plurality of solid portions of the organic barrier layer 14. The organic barrier layer 14 is transparent (having a transmittance higher than, or equal to, 95% for visible light when having a thickness of 1 μm.

The first inorganic barrier layer 12 and the second inorganic barrier layer 16 are each, for example, an SiN layer (e.g., $Si_3N_4$ layer) having a thickness of, for example, 400 nm. The first inorganic barrier layer 12 and the second inorganic barrier layer 16 each have a thickness of 200 nm or greater and 1000 nm or less independently. The thickness of the TFE structure 10 is preferably 400 nm or greater and less than 2 μm, and more preferably 400 nm or greater and less than 1.5 μm. The thickness of the organic barrier layer 14, which depends on the size of the protruding portion of the surface of the first inorganic barrier layer 12 or the size of the particle, may be 1 μm at the maximum. The thickness of the organic barrier layer 14 is typically 200 nm or greater and 500 nm or less.

The TFE structure 10 is formed so as to protect an active region (see the active region R1 in FIG. 2) of the OLED display device 100. As described above, the TFE structure 10 includes, in at least the active region, the first inorganic barrier layer 12, the organic barrier layer 14 and the second inorganic barrier layer 16 in this order, with the first inorganic barrier layer 12 being closest to the OLED 3. The organic barrier layer 14 is not present as a film covering the entirety of the active region, but has openings. Portions of the organic barrier layer 14 where an organic film is actually present, namely, portions except for the openings, will be referred to as "solid portions". The "openings" (may also referred to as "non-solid portions") do not need to be enclosed by the solid portions and may include a cutout portion and the like. In the openings, the first inorganic barrier layer 12 and the second inorganic barrier layer 16 are in direct contact with each other. The openings of the organic barrier layer 14 include at least an opening formed so as to enclose the active region, and the active region is fully enclosed by the portion in which the first inorganic barrier layer 12 and the second inorganic barrier layer 16 are in direct contact with each other (hereinafter, such a portion will be referred to as an "inorganic barrier layer joint portion").

With reference to FIG. 2 through FIG. 7, a structure of, and a method for producing, an OLED display device according to an embodiment of the present invention will be described.

Figure 2:
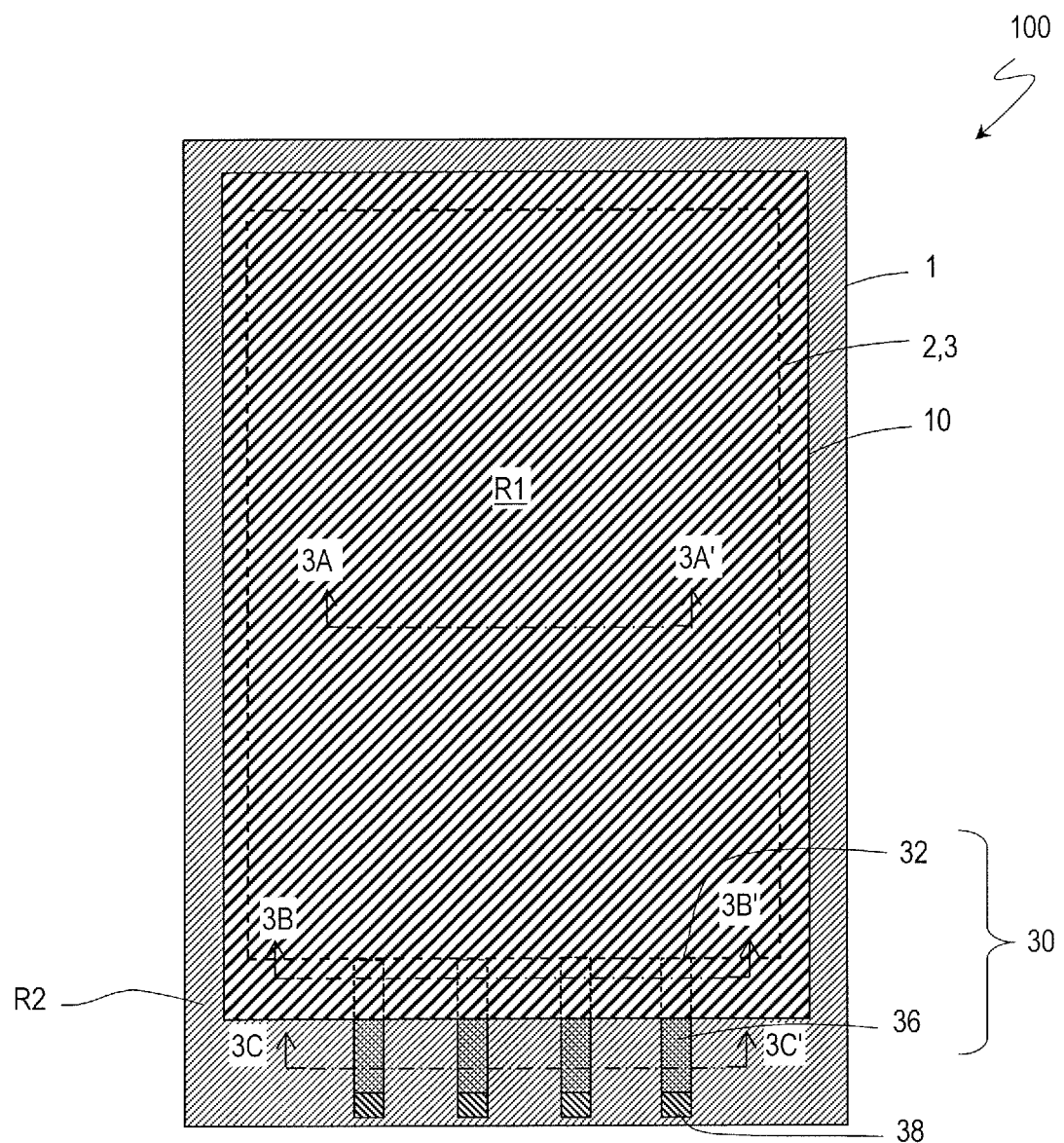
FIG. 2 is a plan view schematically showing a structure of the OLED display device 100 according to embodiment 1 of the present invention.
Figure 3:
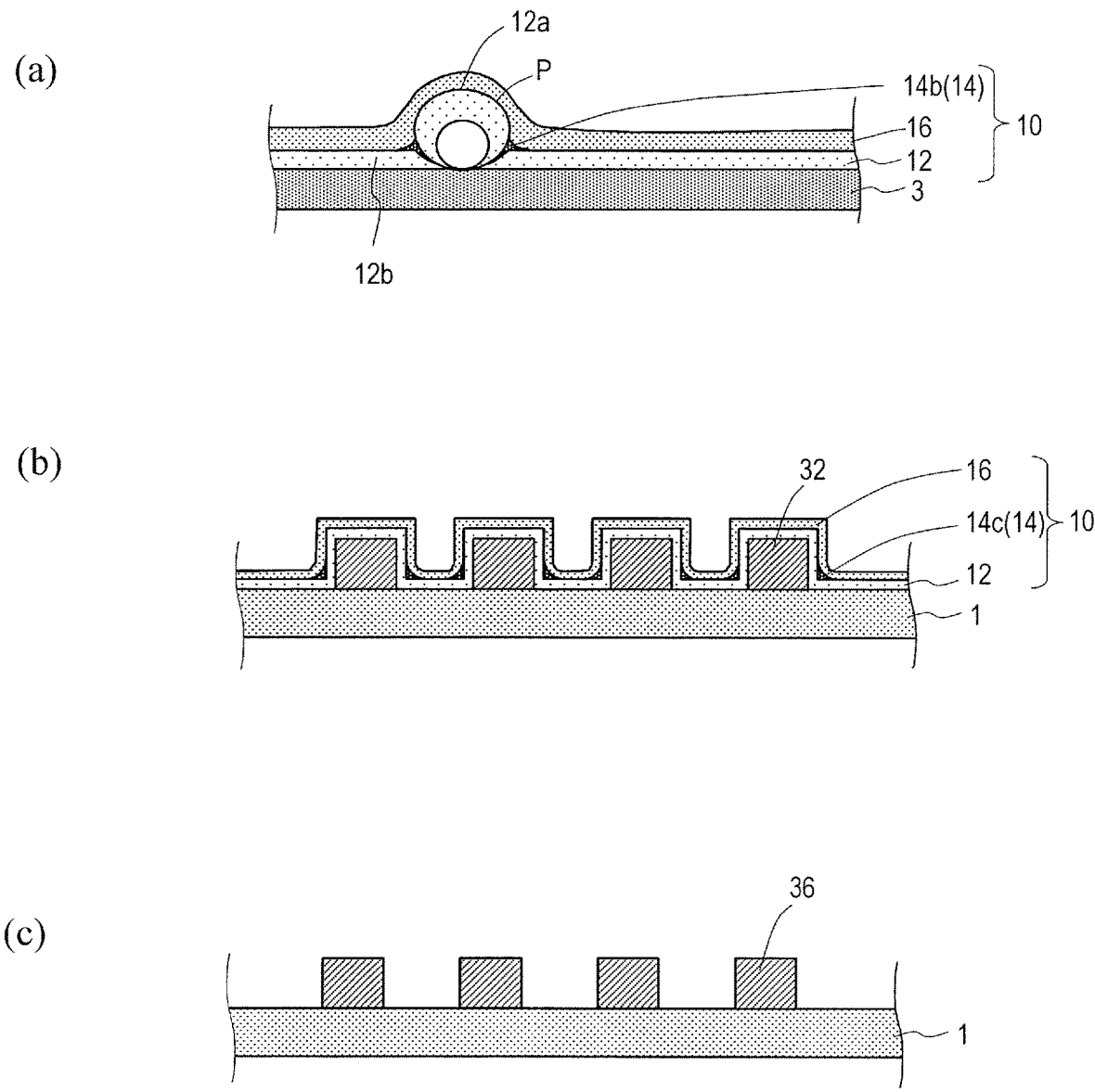
FIG. 3(a) through FIG. 3(c) are each a schematic cross-sectional view of the OLED display device 100.
Figure 4:
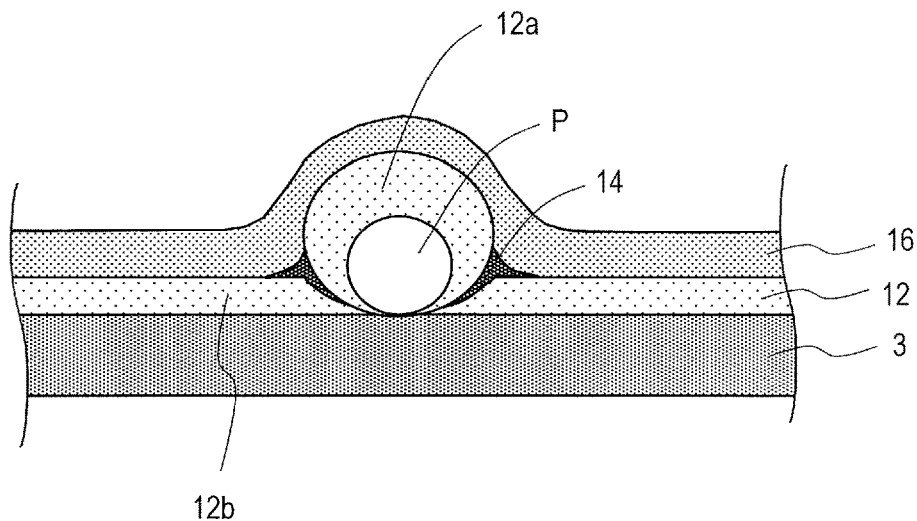
FIG. 4(a) is an enlarged view of a portion including a particle P shown in FIG. 3(a)
FIG. 4(b) is a schematic plan view showing the size relationship among the particle P, a first inorganic barrier layer (SiN layer) covering the particle P, and an organic barrier layer.
FIG. 4(e) is a schematic cross-sectional view of the first inorganic barrier layer covering the particle P.
Figure 4:
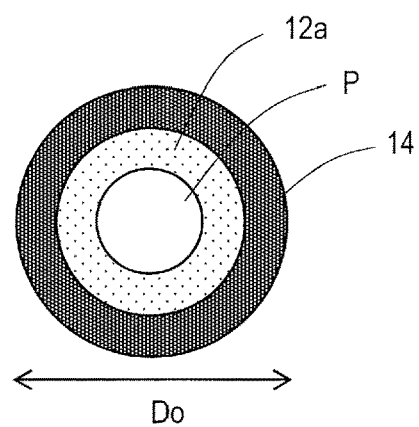
Figure 4:
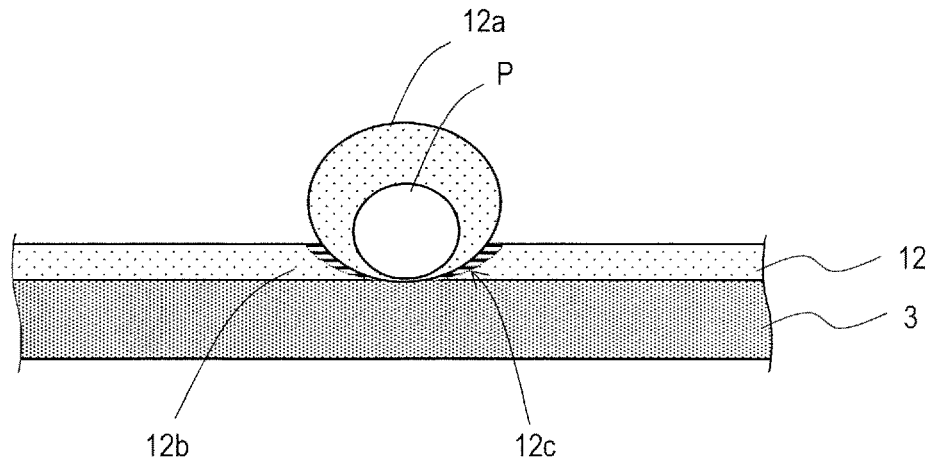

FIG. 2 is a schematic plan view of the OLED display device 100 according to an embodiment of the present invention.

The OLED display device 100 includes the flexible substrate 1, the circuit (back plane) 2 formed on the substrate 1, a plurality of the OLEDs 3 formed or, the circuit 2, and the TFE structure 10 formed on the OLEDs 3. A layer including the plurality of OLEDs 3 may be referred to as an "OLED layer 3". The circuit 2 and the OLED layer 3 may share a part of components. The optional polarizing plate (see reference numeral 4 in FIG. 1) may further be located on the TFE structure 10. In addition, for example, a layer having a touch panel function may be located between the TFE structure 10 and the polarizing plate. Namely, the OLED display device 100 may be altered to a display device including an on-cell type touch panel.

The circuit 2 includes a plurality of TFTs (not shown), and a plurality of gate bus lines (not shown) and a plurality of source bus lines (not shown) each connected with either one of the plurality of TFTs (not shown). The circuit 2 may be a known circuit that drives the plurality of OLEDs 3. The plurality of OLEDs 3 are each connected with either one of the plurality of TFTs included in the circuit 2. The OLEDs 3 may be known OLEDs.

The OLED display device 100 further includes a plurality of terminals 38 located in a peripheral region R2 outer to the active region R1 (region enclosed by the dashed line in FIG. 2), where the plurality of OLEDs 3 are located, and also includes a plurality of lead wires 30 connecting each of the plurality of terminals 36 and either one of the plurality of gate bus lines or either one of the plurality of source bus lines to each other. The TFE structure 10 is formed on the plurality of OLEDs 3 and on a portion of the plurality of lead wires 30 that is close to the active region R1. Namely, the TFE structure 10 covers the entirety of the active region R1 and is also selectively formed on the portion of the plurality of lead wires 30 that is close to the active region R1. Neither a portion of the plurality of lead wires 30 that are closer to the terminals 38, nor the terminals 38, is covered with the TFE structure 10.

Hereinafter, an example in which the lead wires 30 and the terminals 38 are integrally formed in the same conductive layer will be described. Alternatively, the lead wires 30 and the terminals 38 may be formed in different conductive layers (encompassing stack structures).

Now, with reference to FIG. 3(a) through FIG. 3(c), the TFE structure 10 of the OLED display device 100 will be described. FIG. 3(a) is a cross-sectional view taken along line 3A-3A' in FIG. 2. FIG. 3(b) is a cross-sectional view taken along line 3B-3B' in FIG. 2. FIG. 3(c) is a cross-sectional view taken along line 3C-3C in FIG. 2.

As shown in FIG. 3(a) and FIG. 3(b), the TFE structure 10 includes the first inorganic barrier layer 12 formed on the OLED 3, the organic barrier layer 14, and the second inorganic barrier layer 16 in contact with the first inorganic barrier layer 12 and the organic barrier layer 14. The first inorganic barrier layer 12 and the second inorganic barrier layer 16 are each, for example, an SiN layer, and are selectively formed in a predetermined region 30 as to cover the active region R1 by plasma CVD by use of a mask. In general, a surface of a layer formed by a thin film deposition method (e.g., CVD, sputtering, vacuum vapor deposition) reflects a stepped portion in an underlying layer. The organic barrier layer (solid portion) 14 is formed only around the protruding portion of the surface of the first inorganic barrier layer 12.

FIG. 3(a) is a cross-sectional view taken along line 3A-3A' in FIG. 2, and shows a portion including a particle P. The particle P is a microscopic dust particle generated during the production of the OLED display device, and is, for example, a microscopic piece of broken glass, a metal particle or an organic particle. Such a particle is especially easily generated in the case where mask vapor deposition is used.

As shown in FIG. 3(a), the organic barrier layer (solid portion) 14 includes a portion 14b formed around the particle P. A reason for this is that an acrylic monomer supplied after the first inorganic barrier layer 12 is formed is condensed and present locally, namely, around a surface of a first inorganic barrier layer 12a on the particle P (the surface has a tapering angle larger than 90 degrees). The organic barrier layer 14 includes the opening (non-solid portion) on a flat portion of the first inorganic barrier layer 12.

Now, with reference to FIG. 4(a) through FIG. 4(c), a structure of the portion including the particle P will be described. FIG. 4(a) is an enlarged view of the portion including the particle P shown in FIG. 3(a). FIG. 4(b) is a schematic plan view showing the size relationship among the particle P, the first inorganic barrier layer (SiN layer) 12 covering the particle P and the organic barrier layer 14. FIG. 4(c) is a schematic cross-sectional view of the first inorganic barrier layer covering the particle P.

In the case where the particle P (having a diameter that is, for example, longer than, or equal to, 1 μm) is present, a crack (defect) 12c may be formed in the first inorganic barrier layer as shown in FIG. 4(c). As described below, this is considered to be caused by impingement of the SiN layer 12a growing from a surface of the particle P and an SiN layer 12b growing from a flat portion of a surface of the OLED 3. In the case where such a crack 12c is present, the level of barrier property of the TFE structure 10 is decreased.

In the TFE structure 10 of the OLED display device 100, as shown in FIG. 4(a), the organic barrier layer 14 is formed to fill the crack 12c of the first inorganic barrier layer 12, and a surface of the organic barrier layer 14 connects a surface of the first inorganic barrier layer 12a on the particle P and a surface of the first inorganic barrier layer 12b on the flat portion of the OLED 3 to each other continuously and smoothly. The organic barrier layer 14, which is formed by curing a photocurable resin in a liquid state as described below, has a recessed surface by a surface tension. In this state, the photocurable resin exhibits a high level of wettability to the first inorganic barrier layer 12. If the level of wettability of the photocurable resin to the first inorganic barrier layer 12 is low, the surface of the organic barrier layer 14 may protrude. The organic barrier layer 14 may also be formed with a small thickness on the first inorganic barrier layer 12a on the particle P.

The organic barrier layer (solid portion) 14 having the recessed surface connects the surface of the first inorganic barrier layer 12a on the particle P and the surface of the first inorganic barrier layer 12b on the flat portion to each other continuously and smoothly. Therefore, the second inorganic barrier layer 16 formed thereon is a fine film with no defect. As can be seen, even if the particle P is present, the organic barrier layer 14 keeps high the level of barrier property of the TFE structure 10.

As shown in FIG. 4(b), the organic barrier layer 14 (solid portion) is formed in a ring shape around the particle P. Where the particle P has a diameter (equivalent circle diameter) of about 1 μm as seen in a direction normal to the surface of the OLED 3, the ring-shaped solid portion has a diameter $D_0$ (equivalent circle diameter) that is, for example, longer than, or equal to, 2 μm.

In this example, the organic barrier layer 14 is formed only in a discontinuous portion in the first inorganic barrier layer 12 formed on the particle P, and the particle P is already-present before the first inorganic barrier layer 12 is formed on the OLED 3. The particle P may be present on the first inorganic barrier layer 12. In this case, the organic barrier layer 14 is formed only at the border, namely, in a discontinuous portion, between the first inorganic barrier layer 12 and the particle P on the first inorganic barrier layer 12, and thus maintains the barrier property of the TFE structure 10 like in the above-described case. The organic barrier layer 14 may also be formed with a small thickness on the surface of the first inorganic barrier layer 12a on the particle P, or on the surface of the particle P. In this specification, the expression that "the organic barrier layer 14 is present around the particle P" encompasses all these forms.

The organic barrier layer (solid portion) 14 is not limited to being formed as in the example of FIG. 3(a), and may be formed only around the protruding portion of the surface of the first inorganic barrier layer 12 for substantially the same reason. Examples of the other regions where the organic barrier layer (solid portion) 14 may be formed will be described below.

Now, with reference to FIG. 3(b), a structure of the TFE structure 10 on the lead wires 30 will be described. FIG. 3(b) is a cross-sectional view taken along line 3B-3B' in FIG. 2; more specifically, is a cross-sectional view of portions 32, of the lead wires 30, close to the active region R1.

As shown in FIG. 3(b), the organic barrier layer (solid portions) 14 includes portions 14c formed around the protruding portions of the surface of the first inorganic barrier layer 12. The protruding portions reflect the cress-sectional shape of the portions 32 of the lead wires 30.

The lead wires 30 are patterned by the same step as that of, for example, the gate bus lines or the source bus lines. Thus, in this example, the gate bus lines and the source bus lines formed in the active region R1 also have the same cross-sectional structure as that of the portion 32, of each of the lead wires 30, close to the active region R1 shown in FIG. 3(b). It should be noted that typically, a flattening layer is formed on the gate bus lines and the source bus lines formed in the active region R1, and thus no stepped portion is formed at the surface of the first inorganic barrier layer 12 on the gate bus lines and the source bus lines.

The portion 32 of the lead wire 30 may have, for example, a forward tapering side surface portion (inclining side surface portion) having a tapering angle smaller than 90 degrees. In the case where the lead wire 30 includes the forward tapering side surface portion, formation of defects in the first inorganic barrier layer 12 and the second inorganic barrier layer 16 formed on the lead wire 30 is prevented. Namely, the moisture-resistance reliability of the TFE structure 10 is improved. The tapering angle of the forward tapering side surface portion is preferably smaller than, or equal to, 70 degrees.

The active region R1 of the OLED display device 100 is substantially covered with the inorganic barrier layer joint portion, in which the first inorganic barrier layer 12 and the second inorganic barrier layer 16 are in direct contact with each other, except for the regions where the organic barrier layer 14 is selectively formed. Therefore, it does not occur that the organic barrier layer 14 acts as a moisture entrance route to allow the moisture to reach the active region R1 of the OLED display device.

The OLED display device 100 according to an embodiment of the present invention is preferably usable for, for example, medium- to small-sized high-definition smartphones and tablet terminals. In a medium- to small-sized (e.g., 5.7-inch) high-definition (e.g., 500 ppi) OLED display device, it is preferred that lines (encompassing the gate bus lines and the source bus lines) in the active region R1 have a cross-sectional shape, taken in a direction parallel to a line width direction, close to a rectangle (side surfaces of the lines have a tapering angle of about 90 degrees) in order to allow the lines to have a sufficiently low resistance with a limited line width. In order to form the lines having a low resistance, the tapering angle of the forward tapering side surface portion TSF may be larger than 70 degrees and smaller than 90 degrees, or the tapering angle may be about 90 degrees in the entire length of the lines with no forward tapering side surface portion TSF being provided.

Now, FIG. 3(c) will be referred to. FIG. 3(c) is a cross-sectional view of a region where the TFE structure 10 is not formed. In this region, a terminal portion 38 has the same cross-sectional structure as that of portions 36 of the lead wires 30 shown in FIG. 3(c). The portions 36 of the lead wires 30 shown in FIG. 3(e) may have a tapering angle of, for example, about 90 degrees.

Figure 5:
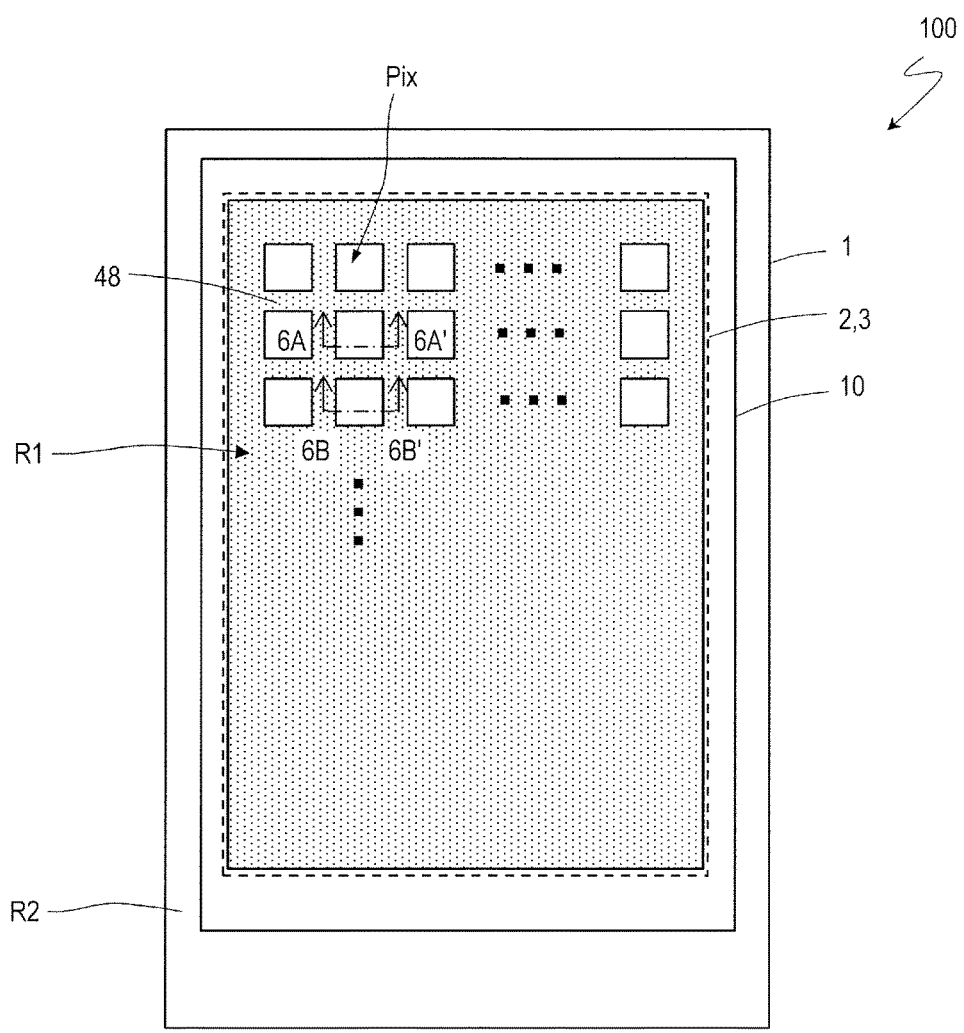
FIG. 5 is a plan view schematically showing a bank layer 48 included in the OLED display device 100.
Figure 6:
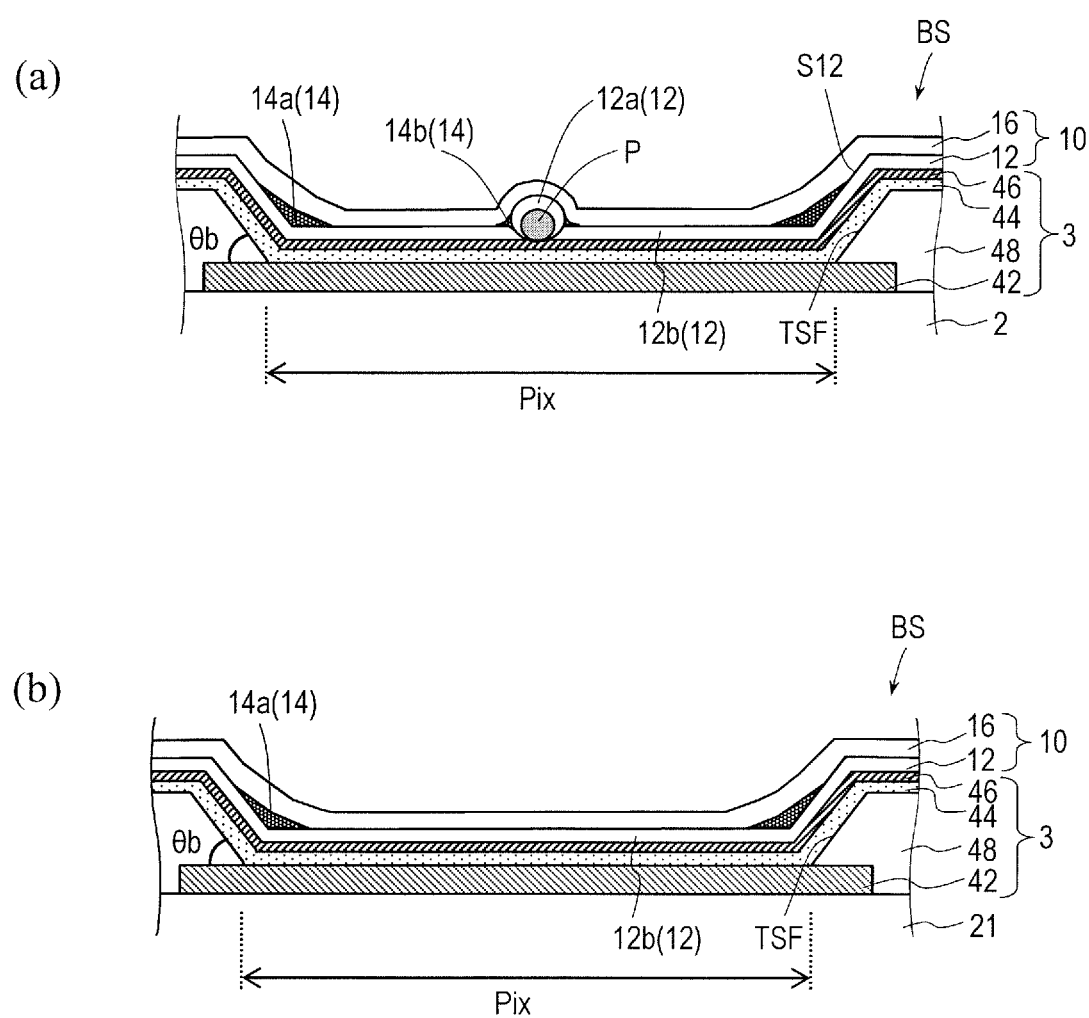
FIG. 6 provides cross-sectional views schematically showing a pixel and the bank layer 48 included in the OLED display device 100.

Now, with reference to FIG. 5 and FIG. 6, the organic barrier layer 14 formed around a bank structure BS will be described. The organic barrier layer (solid portion) 14 is also formed around a protruding portion of the surface of a portion, of the first inorganic barrier layer 12, that is used to form the bank structure BS. FIG. 5 is a plan view schematically showing the plurality of pixels and a bank layer 48 included in the OLED display device 100. FIG. 6(a) is a cross-sectional view taken along line 6A-6A' in FIG. 5, and FIG. 6(b) is a cross-sectional view taken along line 6B-6B' in FIG. 5.

As shown in FIG. 6(a), the OLED display device 100 further includes the bank structure BS defining each of the plurality of pixels. The bank structure BS has an inclining surface enclosing each of the plurality of pixels. The plurality of solid portions of the organic barrier layer 14 include pixel periphery solid portions 14a each extending, on the first inorganic barrier layer 12, from an inclining surface S12 thereof to a peripheral area in a corresponding pixel of the plurality of pixels.

As shown in FIG. 6(a), the bank structure BS includes the bank layer 48 formed of an insulating material (the bank layer may be referred to also as a "PDL (Pixel Defining Layer)"). The bank layer 48 is formed between a lower electrode 42 and an organic layer 44 of the OLED 3. As shown in FIG. 6(a), the OLED 3 includes the lower electrode 42, the organic layer 44 formed on the lower electrode 42, and an upper electrode 46 formed on the organic layer 44. In this example, the lower electrode 42 and the upper electrode 46 respectively act as an anode and a cathode of the OLED 3. The upper electrode 46 is a common electrode formed for the entirety of the pixels in the active region. By contrast, the lower electrode (pixel electrode) 42 is formed for each of the pixels. In the structure in which the bank layer 48 is present between the lower electrode 42 and the organic layer 44, no holes are injected from the lower electrode 42 into the organic layer 44. Therefore, the region where the bank layer 48 is present does not act as a pixel Pix. Thus, the bank layer 48 defines an outer perimeter of the pixel Pix.

As shown in FIG. 5, each pixel Pix is defined by an opening in the bank layer 48. The bank layer 48 is formed to be, for example, lattice-shaped. A side surface of the opening of the bank layer 48 has an inclining surface including the forward tapering side surface portion TSF. The inclining surface of the bank layer 48 encloses each pixel. The bank layer 48 is formed of, for example, a photosensitive resin (e.g., polyimide or acrylic resin). The bank layer 48 has a thickness of, for example, 1 μm to 2 μm. The inclining surface of the bank layer 48 is inclined at an inclination angle θb that is smaller than, or equal to, 60 degrees. If the inclination angle θb of the inclining surface of the bank layer 48 is larger than 60 degrees, a defect may be caused in layers located on the bank layer 48. The layers located on the bank layer 48 (including, for example, the organic layer 44, the upper electrode 46, the first inorganic barrier layer 12 and the second inorganic barrier layer 16) may be included in the bank structure BS. The layers included in the bank structure BS may each have an inclining surface enclosing each of the plurality of pixels. In the case where each of the layers formed on the bank layer 48 is thinner than the bank layer 48, the inclination angle of the inclining surface of the bank structure BS is considered to be substantially equal to the inclination angle θb of the inclining surface of the bank layer 48. The first inorganic barrier layer 12 is included in the bank structure BS, and has the inclining surface 312 enclosing each of the plurality of pixels. The organic barrier layer (solid portion) 14 includes the pixel periphery solid portion 14a extending, on the first inorganic barrier layer 12 from the inclining surface 312 thereof to a peripheral area in the pixel.

As shown in, for example, FIG. 6(a), in a central area of the pixel, the organic barrier layer 14 is formed only in a discontinuous portion formed in the first inorganic barrier layer 12 by the particle P. Namely, as shown in FIG. 6(b), the organic barrier layer 14 is not present in a central area, of the pixel, where no particle P is present. The OLED display device with no particle P does not include the organic barrier layer in the central area of the pixel. The particle P has a size (equivalent spherical diameter) of, typically, 0.3 μm or longer and 5 μm or shorter. A board of G4.5 (730 mm×920 mm) may have, for example, several tens to about 100 particles. One OLED display device (active region) may have approximately several particles. Needless to say, there are OLED display devices with no particle P. The organic barrier layer 14 is formed of, for example, a cured photocurable resin. A portion where the photocurable resin is actually present is referred to as a "solid portion". As described above, the organic barrier layer 14 (solid portion)

is selectively formed only around a protruding portion of the surface of the first inorganic barrier layer 12.

As shown in, for example, FIG. 6(a), in the case where there is a particle P in the central area of the pixel, the organic barrier layer 14 is formed in a discontinuous portion formed by the particle P. As described above with reference to FIG. 4(b), the organic barrier layer (solid portion) 14 is formed in a ring shape around the particle P. Where the particle P has a diameter (equivalent circle diameter) of, for example, about 1 urn as seen in a direction normal to the surface of the OLED 3, the ring-shaped solid portion has a diameter $D_0$ (equivalent circle diameter) that is, for example, longer than, or equal to, 2 μm. In the case of, for example, a 5.7-inch display device having 2560×1440 pixels (about 500 ppi), the pixel pitch is 49 μm. The size of the particle P and the size of the organic barrier layer (solid portion) 14 formed around the particle P are sufficiently smaller than the pixel pitch. Therefore, a change in the transmittance caused by the barrier layer 14 (solid portion) formed around the particle P does not have a significant influence on the display.

Figure 7:
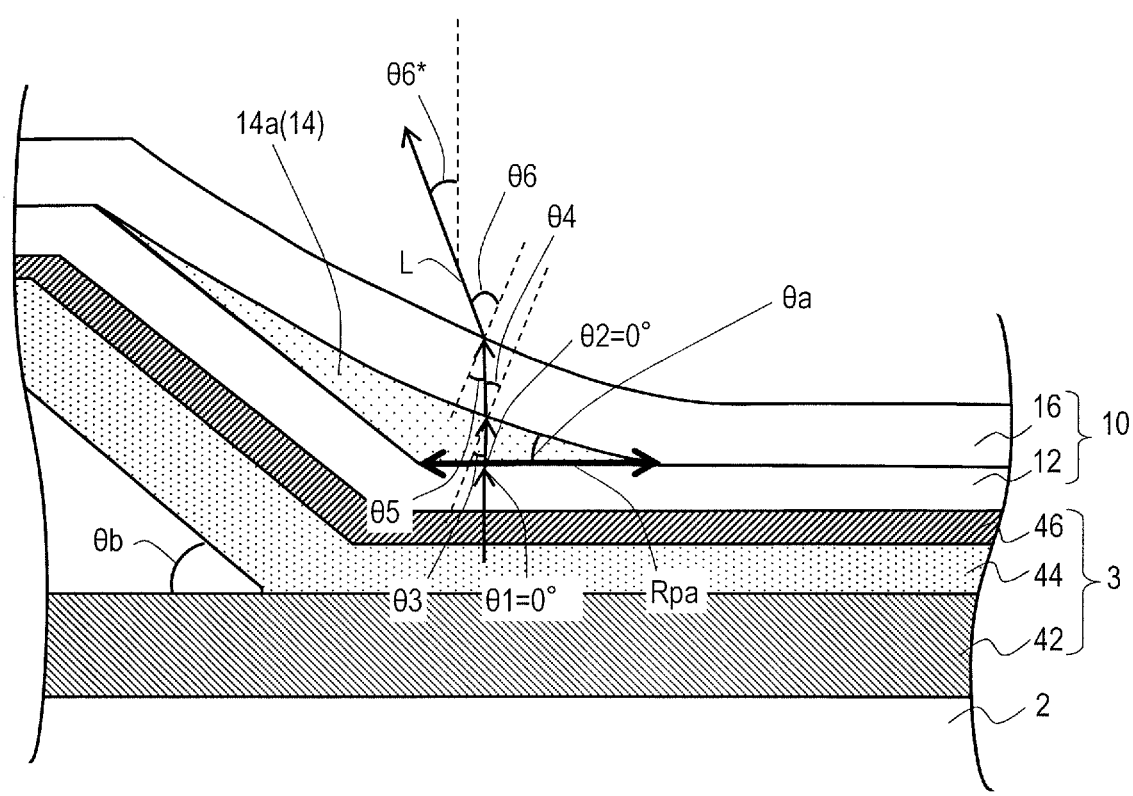
FIG. 7 is a schematic cross-sectional view provided to describe functions and effects of a pixel periphery solid portion 14a of the TFE structure 10 included in the OLED display device 100.

With reference to FIG. 7, functions and effects of the pixel periphery solid portion 14a (organic barrier layer 14) of the TFE structure 10 included in the OLED display device 100 will be described.

As described above, the OLED display device 100 includes the element substrate including the plurality of organic EL elements respectively located in the plurality of pixels and the bank layer 48 defining each of the plurality of pixels, and also includes the TFE structure 10 covering the plurality of pixels. The bank layer 48 has the inclining surface enclosing each of the plurality of pixels. The TFE structure 10 includes the first inorganic barrier layer 12, the organic barrier layer 14 including the plurality of solid portions that are in contact with the top surface of the first inorganic barrier layer 12 and are distributed discretely, and the second inorganic barrier layer 16 in contact with the top surface of the first inorganic barrier layer 12 and the top surfaces of the plurality of solid portions of the organic barrier layer 14. The plurality of solid portions include the pixel periphery solid portions 14a each extending, on the first inorganic barrier layer 12, from the inclining surface thereof to a peripheral area in the corresponding pixel. The pixel periphery solid portions 14a each extend along the entirety of a circumference of the pixel. A refractive index n0 of the organic barrier layer 14 is smaller than a refractive index n1 of the first inorganic barrier layer 12. An inclination angle θa of a top surface of each of the pixel periphery solid portions 14a is larger than, or equal to, 20 degrees. It is preferred that the inclination angle θa of the top surface is larger than, or equal to, 30 degrees. It is preferred that the inclination angle θa of the top surface is smaller than, or equal to, 40 degrees. The inclination angle θa is substantially the same along the entirety of the circumference of the pixel. The plurality of pixels each have the bank layer of substantially the same structure. In this specification, the expression "substantially the same" indicates that the numerical figure is within the production tolerance, unless otherwise specified.

The TFE structure 10 of the OLED display device 100 includes the pixel periphery solid portions 14a described above-Therefore, the TFE structure 10 has a higher front luminance and a higher directivity than those of a conventional TFE structure. Hereinafter, a reason therefor will be described.

A light bean L represented by arrow L in FIG. 7 is now paid attention to. Among light beams that are output from the organic layer 44, pass the TFE structure 10 and are output from the OLED display device 100, the light beam L represents a track of a light beam that is perpendicularly incident on a portion, of the pixel periphery solid portion 14a, that is formed on a flat region Rpa in the pixel. Namely, the light beam L, output from the organic: layer 44 in a direction normal to the display plane, passes the upper electrode 46 and the first inorganic barrier layer 12 and is incident on the pixel periphery solid portion 14a. An incidence angle θ1 of the light beam L on the pixel periphery solid portion 14a is 0 degrees. The light beam L, after entering the pixel periphery solid portion 14a, advances in a direction of θ2=0°. Then, the light beam L is incident on the top surface of the pixel periphery solid portion 14a (the top surface has an inclination angle of θa) at an angle of θ3, is output from the top surface of the pixel periphery solid portion 14a at an angel of θ4, and is incident on the second inorganic barrier layer 16.

The refractive index n0 of the organic barrier layer 14 is smaller than the refractive index n1 of the second inorganic barrier layer 16 (n0<n1). The organic barrier layer 14 is formed of, for example, a photocurable acrylic resin having a refractive index of 1.54, and the second inorganic barrier layer 16 is formed of, for example, silicon nitride ($Si_3N_4$) having a refractive index of 1.80 or larger and 1.90 or smaller. Since the refractive index n0 of the organic barrier layer 14<the refractive index n1 of the second inorganic barrier layer 16, θ3>θ4 based on Snell's law. Silicon nitride ($Si_3N_4$) having a refractive index of 1.80 or larger and 1.90 or smaller has a superb barrier property. It is preferred that the first inorganic barrier layer 12 is also formed of silicon nitride ($Si_3N_4$) having a refractive index of 1.80 or larger and 1.90 or smaller. As is well known, the refractive index may be controlled by the film formation conditions of the silicon nitride film.

Next, the light beam L is incident on an interface between the second inorganic barrier layer 16 and the air at an angle of θ5, and is output from the second inorganic barrier layer 16 at an angle of θ6. The refractive index of the air is smaller than the refractive index n1 of the second inorganic barrier layer 16. Therefore, θ6>θ5 based on Snell's law. θ6* is the angle θ6 represented as an angle with respect to the direction normal to the display plane. Namely, θ6* represents the polar angle of the light beam L, output from the OLED display device 100, with respect to the direction normal to the display plane. Herein, a case where the top surface of the second inorganic barrier layer 16 is in contact with the air is described. Even in the case where the top surface of the second inorganic barrier layer 16 is in contact with an organic insulating layer and/or an inorganic; insulating layer (having a refractive index smaller than the refractive index n1 of the second inorganic barrier layer 16), the light beam L behaves in substantially the same as manner as that described above.

An influence exerted on θ6* by presence/absence of the organic barrier layer, namely, the pixel periphery solid portion 14a was found, and Table 1 shows the results. Table 1 shows the cases where the inclination angle θa of the top surface of the pixel periphery solid portion 14a is 10°, 20°, 30° and 40°. The numerical figures in the parentheses regarding θ6* in Table 1 are each a value obtained by subtracting a value of θ6* in the case where the organic barrier layer is absent from a value of θ6* in the case where the organic barrier layer is present.

In this example, the refractive index n0 of the organic barrier layer was 1.54, and the refractive index n1 of the second inorganic barrier layer 16 was 1.85. The structure in the case where the organic barrier layer was absent were found by setting the refractive index n0 of the organic barrier layer 14 to 1.85 (=n1).

TABLE 1

| ORGANIC BARRIER LAYER | n1 | n0 | θa (°) | θ6* (°) |
|---|---|---|---|---|
| ABSENT | 1.85 | 1.85 | 10 | 8.7 |
| PRESENT | 1.85 | 1.54 | 10 | 5.5 (−3.2) |
| ABSENT | 1.85 | 1.85 | 20 | 19.3 |
| PRESENT | 1.85 | 1.54 | 20 | 11.8 (−7.5) |
| ABSENT | 1.85 | 1.85 | 30 | 37.7 |
| PRESENT | 1.85 | 1.54 | 30 | 20.4 (−17.3) |
| ABSENT | 1.85 | 1.85 | 40 | — |
| PRESENT | 1.85 | 1.54 | 40 | 41.8 |

As can be seen from Table 1, provision of the organic barrier layer 14 decreases the values of θ6* Especially in the case where the inclination angle θa of the top surface of the pixel periphery solid portion 14a is larger than, or equal to, 20 degrees, there is a conspicuous tendency that the value of θ6* is decreased. Namely, the front luminance and the directivity of the organic EL display device may be effectively improved by setting the inclination angle θa of the top surface of the pixel periphery solid portion 14a to be larger than, or equal to, 20 degrees. This advantage is more significant in the case where the inclination angle θa of the top surface of the pixel periphery solid portion 14a is larger than, or equal to, 30 degrees. It should be noted that θa is preferably smaller than, or equal to, 40 degrees. In the case where θa exceeds 40 degrees, the amount of the light beam output from the organic EL display device may be decreased. Table 1 does not show any numerical figure in the case where the organic barrier layer is absent and θa is 40 degrees. This indicates that the light beam L is not output from the second inorganic barrier layer 16. Provision of the organic barrier layer 14 may allow the light beam L to be output from the second inorganic barrier layer 16 at θ6*=41.8° even when θa is 40 degrees. However, when θa exceeds 40 degrees, the light beam may not be output from the second inorganic barrier layer 16. Needless to say, the upper limit of θa depends on the values of the refractive index of the organic barrier layer and the second inorganic barrier layer, and is found by a calculation made based on Snell's law as described above.

It is preferred that the refractive index n1 of the second inorganic barrier layer 16 and the refractive index n0 of the organic barrier layer 14 have a difference (Δn1=n1−n0) that is larger than, or equal to, 0.25. As shown above as an example (Δn=1.85−1.54=0.31), it is further preferred that Δn is larger than, or equal to, 0.3.

The inclination angle θa of the top surface of the pixel periphery solid portion 14a is controlled by the inclination angle θb of the inclining surface of the bank layer 48, the viscosity of the resin material used to form the organic barrier layer 14, and the like. In order to control the inclination angle θa of the top surface of the pixel periphery solid portion 14a to be 20 degrees or larger and A0 degrees or smaller, it is preferred that the inclination angle θb of the inclining surface of the bank layer 48 is 20 degrees or larger and 60 degrees or smaller. As long as the inclination angle θb of the inclining surface of the bank layer 48 is in this range, it is easy to control the inclination angle θa of the top surface of the pixel periphery solid portion 14a to be 20 degrees or larger and 40 degrees or smaller by use of a photocurable resin (e.g., ultraviolet-curable acrylic resin) having a relatively low viscosity. As long as the inclination angle θb of the inclining surface of the bank layer 48 is smaller than, or equal to, 60 degrees, there is no possibility that a layer (e.g., line or electrode) formed on the bank layer 48 is ruptured by the stepped portion.

As long as the inclination angle θa of the top surface of the pixel periphery solid portion 14a is larger than, or equal to, 20 degrees, the problem that the organic barrier layer 14 is delaminated as described in Patent Document No. 3 is suppressed. In the case where a resin having a high adhesiveness (wettability) to the bank layer is used, the resultant pixel periphery solid portion 14a has a recessed surface. In other words, it is preferred to use such a resin material as to form the pixel periphery solid portion 14a having a recessed surface to form the organic barrier layer 14.

It is preferred that the organic barrier layer 14 is formed of a colorless and transparent photocurable resin (e.g., ultraviolet-curable acrylic resin). A reason for this is that if the organic barrier layer 14 absorbs visible light, the light utilization efficiency (luminance) is decreased.

It is preferred that the effect, provided by the pixel periphery solid portion 14a, of improving the front luminance and the directivity is uniformly exhibited in the entirety of the circumference of the pixel. Therefore, as described above, the plurality of pixels each have the bank layer 48 and the pixel periphery solid portion 14a of substantially the sane structure in the entire circumference thereof. If the structure of the bank layer 48 or the pixel periphery solid portion 14a is different in a part of the circumference of the pixel, the luminous intensity distribution is different. This may cause a phenomenon that, for example, the display is colored differently when being viewed at a particular oblique viewing angle.

The organic barrier layer 14 may be formed by the method described in, for example, Patent Document No. 1 or 2. For example, a vapor-like or mist-like organic material (e.g., acrylic monomer) is supplied, in a chamber, onto an element substrata maintained at a temperature lower than, or equal to, room temperature, and is condensed on the element substrate. The organic material put into a liquid state is located locally, more specifically, at the border between the side surface of the protruding portion and the flat portion of the first inorganic barrier layer 12 by a capillary action or a surface tension of the organic material. Then, the organic material is irradiated with, for example, ultraviolet rays to form the solid portion of the organic barrier layer (e.g., acrylic resin layer) 14 at the border, namely, around the protruding portion. The organic barrier layer 14 formed by this method includes substantially no solid portion on the flat portion. Regarding the method for forming the organic barrier layer 14, the disclosures of Patent Documents Nos. 1 and 2 are incorporated herein by reference. At this point, the viscosity, the wettability to the inclining surface and the like of the photocurable resin are controlled such that a liquid film is formed on the inclining surface of the ban's layer. The surface of the inclining surface may be modified. For the formation of the organic barrier layer 14, the thickness of the resin layer to be formed first (e.g., to lass than 100 nm) and/or ashing conditions (including time) may be adjusted.

The organic barrier layer 14 may be formed by, for example, spraying, spin-coating, slit-coating, screen printing or inkjet printing. The method for forming the organic barrier layer 14 may further include a step of ashing. The organic barrier layer may be formed of a photosensitive resin, and mask exposure may be performed. The pixel periphery solid portion may be formed, and also the inorganic barrier layer joint portion, where the first inorganic barrier layer and the second inorganic barrier layer are in direct contact with each other, may also be formed, by the mask exposure.

As described above, silicon nitride ($Si_3N_4$) having a refractive index of 1.80 or larger and 1.90 or smaller is preferably usable for the first inorganic barrier layer and the second inorganic barrier layer. Alternatively, an SiON layer, an SiNO layer, an $Al_2O_3$ layer or the like having a refractive index n1 larger than, or equal to, 1.75 may be used for the first inorganic barrier layer and the second inorganic barrier layer.

INDUSTRIAL APPLICABILITY

Embodiments of the present invention are applicable to an organic EL display device, especially, a flexible organic EL display device, and a method for producing the same.

REFERENCE SIGNS LIST 1 substrate (flexible substrate)
2 circuit
3 OLED layer
4 polarizing plate
10 TFE structure
12 first inorganic barrier layer (SiN layer)
14 organic barrier layer
14a pixel periphery solid portion
16 second inorganic barrier layer (SiN layer)
30 lead wire
38 terminal portion
38 terminal
42 lower electrode
44 organic layer
46 upper electrode
48 bank layer
100 OLED display device
BS bank structure
P particle
Pix pixel
R1 active region
R2 peripheral region

The invention claimed is:

1. An organic EL display device including a plurality of pixels, comprising:
an element substrate including a substrate, a plurality of organic EL elements supported by the substrate and respectively located in the plurality of pixels, and a bank layer defining each of the plurality of pixels; and
a thin film encapsulation structure covering the plurality of pixels,
wherein the bank layer has an inclining surface enclosing each of the plurality of pixels,
wherein the thin film encapsulation structure includes a first inorganic barrier layer, an organic barrier layer including a plurality of solid portions in contact with a top surface of the first inorganic barrier layer and distributed discretely, and a second inorganic barrier layer in contact with the top surface of the first inorganic barrier layer and top surfaces of the plurality of solid portions of the organic barrier layer,
wherein the plurality of solid portions include pixel periphery solid portions each extending, on the first inorganic barrier layer, from a portion on the inclining surface to a peripheral area in a corresponding pixel of the plurality of pixels, the pixel periphery solid portions each extending along the entirety of a circumference of the pixel, and
wherein a refractive index n0 of the organic barrier layer is smaller than a refractive index n1 of the second inorganic barrier layer, and the top surfaces of the pixel periphery solid portions each have an inclination angle θa larger than, or equal to, 20 degrees, and
wherein a refractive index of the first inorganic barrier layer is equal to the refractive index n1 of the second inorganic barrier layer.

2. The organic EL display device of claim 1, wherein the inclination angle θa of each of the top surfaces of the pixel periphery solid portions is smaller than, or equal to, 40 degrees.

3. The organic EL display device of claim 1, wherein the inclining surface of the bank layer has an inclination angle θb of 20 degrees or larger and 60 degrees or smaller.

4. The organic EL display device of claim 1, wherein the refractive index n1 of the second inorganic barrier layer and the refractive index n0 of the organic barrier layer have a difference (Δn1=n1−n0) that is larger than, or equal to, 0.25.

5. The organic EL display device of claim 1, wherein the refractive index n1 of the second inorganic barrier layer is 1.75 or larger and 1.90 or smaller.

6. The organic EL display device of claim 1, wherein the pixel periphery solid portions each have a recessed surface.

7. A method for producing the organic EL display device, the organic EL display device including a plurality of pixels, comprising:
an element substrate including a substrate, a plurality of organic EL elements supported by the substrate and respectively located in the plurality of pixels, and a bank layer defining each of the plurality of pixels; and
a thin film encapsulation structure covering the plurality of pixels,
wherein the bank layer has an inclining surface enclosing each of the plurality of pixels,
wherein the thin film encapsulation structure includes a first inorganic barrier layer, an organic barrier layer including a plurality of solid portions in contact with a top surface of the first inorganic barrier layer and distributed discretely, and a second inorganic barrier layer in contact with the top surface of the first inorganic barrier layer and top surfaces of the plurality of solid portions of the organic barrier layer,
wherein the plurality of solid portions include pixel periphery solid portions each extending, on the first inorganic barrier layer, from a portion on the inclining surface to a peripheral area in a corresponding pixel of the plurality of pixels, the pixel periphery solid portions each extending along the entirety of a circumference of the pixel, and
wherein a refractive index n0 of the organic barrier layer is smaller than a refractive index n1 of the second inorganic barrier layer, and the top surfaces of the pixel periphery solid portions each have an inclination angle θa larger than, or equal to, 20 degrees, and
wherein a refractive index of the first inorganic barrier layer is equal to the refractive index n1 of the second inorganic barrier layer,
wherein the step of forming the thin film encapsulation structure includes the steps of:
preparing the element substrate having the first inorganic barrier layer formed thereon in a chamber;
supplying a vapor-like or mist-like photocurable resin into the chamber;

condensing the photocurable resin on the first inorganic barrier layer to form a liquid film;
irradiating the liquid film of the photocurable resin with light to form a photocurable resin layer; and
partially ashing the photocurable resin layer to form the organic barrier layer.

8. The method of claim 7, wherein the inclination angle θa of each of the top surfaces of the pixel periphery solid portions is smaller than, or equal to, 40 degrees.

9. The method of claim 7, wherein the inclining surface of the bank layer has an inclination angle θb of 20 degrees or larger and 60 degrees or smaller.

10. The method of claim 7, wherein the refractive index n1 of the second inorganic barrier layer and the refractive index n0 of the organic barrier layer have a difference (Δn1=n1−n0) that is larger than, or equal to, 0.25.

11. The method of claim 7, wherein the refractive index n1 of the second inorganic barrier layer is 1.75 or larger and 1.90 or smaller.

12. The method of claim 7, wherein a refractive index of the first inorganic barrier layer is equal to the refractive index n1 of the second inorganic barrier layer.

13. The method of claim 7, wherein the pixel periphery solid portions each have a recessed surface.

* * * * *